United States Patent

Hargash et al.

(10) Patent No.: US 7,489,494 B2
(45) Date of Patent: *Feb. 10, 2009

(54) GUARD WAFER FOR SEMICONDUCTOR STRUCTURE FABRICATION

(75) Inventors: Scott M. Hargash, Esopus, NY (US);
Pavel Smetana, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/101,231

(22) Filed: Apr. 11, 2008

(65) Prior Publication Data

US 2008/0210161 A1 Sep. 4, 2008

Related U.S. Application Data

(63) Continuation of application No. 10/907,508, filed on Apr. 4, 2005, now Pat. No. 7,372,689.

(51) Int. Cl.
*H02N 13/00* (2006.01)
(52) U.S. Cl. .................................. 361/234; 204/298.11
(58) Field of Classification Search ................. 361/234; 204/298.11
See application file for complete search history.

(56) References Cited

U.S. PATENT DOCUMENTS

| 6,014,979 | A | * | 1/2000 | Van Autryve et al. ........ 134/1.1 |
| 6,468,404 | B2 | | 10/2002 | Lu et al. |
| 6,589,398 | B1 | | 7/2003 | Lu et al. |
| 6,756,319 | B2 | * | 6/2004 | Kim ........................... 438/761 |
| 2002/0197144 | A1 | | 12/2002 | Blank et al. |

* cited by examiner

*Primary Examiner*—Ronald W Leja
(74) *Attorney, Agent, or Firm*—Schmeiser, Olsen & Watts; Steven Capella

(57) ABSTRACT

An apparatus which allows tightly coupling of the device wafer to the electrostatic chuck of the process chamber after the process chamber is conditioned. The apparatus includes (a) a process chamber; (b) a chuck in the process chamber; (c) a guard wafer placed on and in direct physical contact with the chuck; and (d) a particle restraining layer on essentially all surfaces that are exposed to the ambient inside the process chamber. The particle restraining layer has a thickness in a first direction of at least 500 nm. The first direction is essentially perpendicular to an interfacing surface between the particle restraining layer and the chuck. The guard wafer comprises a material selected from the group consisting of a metal and a semiconductor oxide.

7 Claims, 2 Drawing Sheets

GUARD WAFER FOR SEMICONDUCTOR STRUCTURE FABRICATION

This application is a continuation application claiming priority to Ser. No. 10/907,508, filed Apr. 4, 2005 now U.S. Pat. No. 7,372,689.

BACKGROUND OF THE INVENTION

1. Technical Field

The present invention relates to guard wafers, and more specifically, to guard wafers used in semiconductor structure fabrication.

2. Related Art

A typical thin film deposition process for forming a thin film on a device wafer (i.e., a wafer on which electrical devices are to be formed) is usually performed in a process chamber. More specifically, the device wafer is placed on and held in place by an electrostatic chuck in the process chamber, and then the thin film is deposited on the device wafer. Sometimes, the process chamber is conditioned by depositing a thick metal (e.g., copper) layer on all surfaces inside of the process chamber. The purpose of this thick metal layer is to absorb and restrain particles residing on the surfaces inside the process chamber so that these particles will not interfere with the ensuing thin film deposition processes performed in the process chamber. However, the thick metal layer will also form on the electrostatic chuck. As a result, a device wafer to be processed after the process chamber is conditioned, when being placed on the electrostatic chuck, could not come into direct physical contact with the top surface of the electrostatic chuck. Therefore, the device wafer could not be tightly coupled to the electrostatic chuck. This might detrimentally affect the accuracy of the ensuing fabrication steps.

As a result, there is a need for an apparatus (and method for operating the same) which allows tightly coupling the device wafer to the electrostatic chuck of the process chamber after the process chamber is conditioned.

SUMMARY OF THE INVENTION

The present invention provides an apparatus, comprising (a) a process chamber; (b) a chuck in the process chamber; (c) a guard wafer placed on and in direct physical contact with the chuck; and (d) a particle restraining layer on essentially all surfaces that are exposed to the ambient inside the process chamber, wherein the particle restraining layer has a thickness in a first direction of at least 500 nm, wherein the first direction is essentially perpendicular to an interfacing surface between the particle restraining layer and the chuck, and wherein the guard wafer comprises a material selected from the group consisting of a metal and a semiconductor oxide.

The present invention also provides an apparatus operation method, comprising providing (i) a process chamber and (ii) a chuck in the process chamber; placing a guard wafer on and in direct physical contact with the chuck via a top surface of the chuck; and forming a particle restraining layer on essentially all surfaces that are exposed to the ambient inside the process chamber, wherein the particle restraining layer has a thickness in a first direction of at least 500 nm, wherein the first direction is essentially perpendicular to an interfacing surface between the particle restraining layer and the chuck, and wherein the guard wafer comprises a material selected from the group consisting of a metal and a semiconductor oxide.

The present invention also provides an apparatus (and method for operating the same) which allows tightly coupling a device wafer to an electrostatic chuck of a process chamber after the process chamber is conditioned.

DETAILED DESCRIPTION OF THE INVENTION

Figure 1:
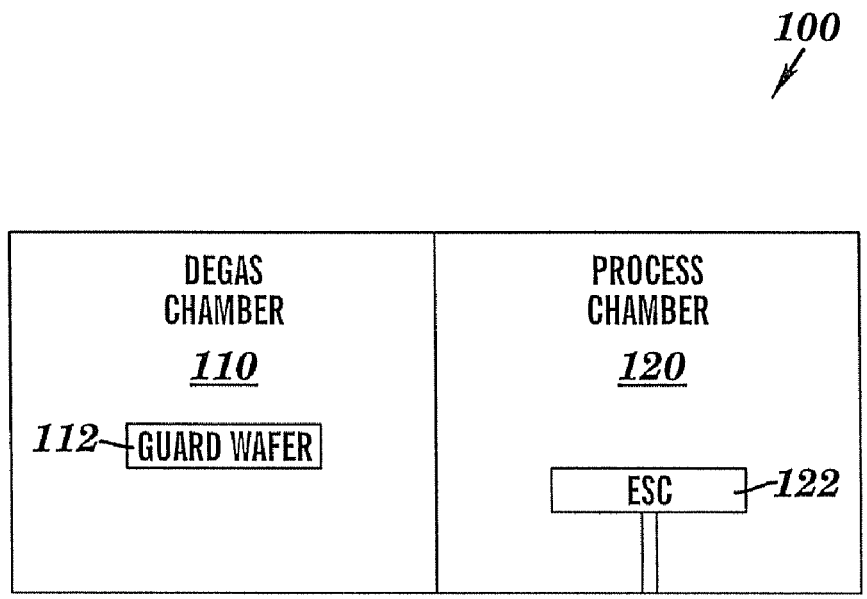
FIGS. 1-4 illustrate a block diagram of an apparatus and the operation of the apparatus for a thin film deposition process, in accordance with embodiments of the present invention.

FIGS. 1-4 illustrates a block diagram of an apparatus 100 and the operation of the apparatus 100 to perform a thin film deposition process, in accordance with embodiments of the present invention. More specifically, with reference to FIG. 1, the apparatus 100 can comprise a degas chamber 110 and a process chamber 120. The process chamber 120 can comprise an electrostatic chuck 122 used for holding a device wafer (not shown) for processing. In one embodiment, the apparatus 100 can be operated as follows to perform the thin film deposition process. First, a guard wafer 112 can be placed in the degas chamber 110 for a baking step in which the guard wafer 112 can be subjected to high temperatures in a range of, illustratively, 100° C. or greater. At such temperatures, most water moisture in the guard wafer 112 escapes the guard wafer 112. Without this baking step, when the guard wafer 112 is later used in the process chamber 120, water moisture may escape from the guard wafer 112 and contaminate the ambient inside the process chamber 120.

Figure 2:
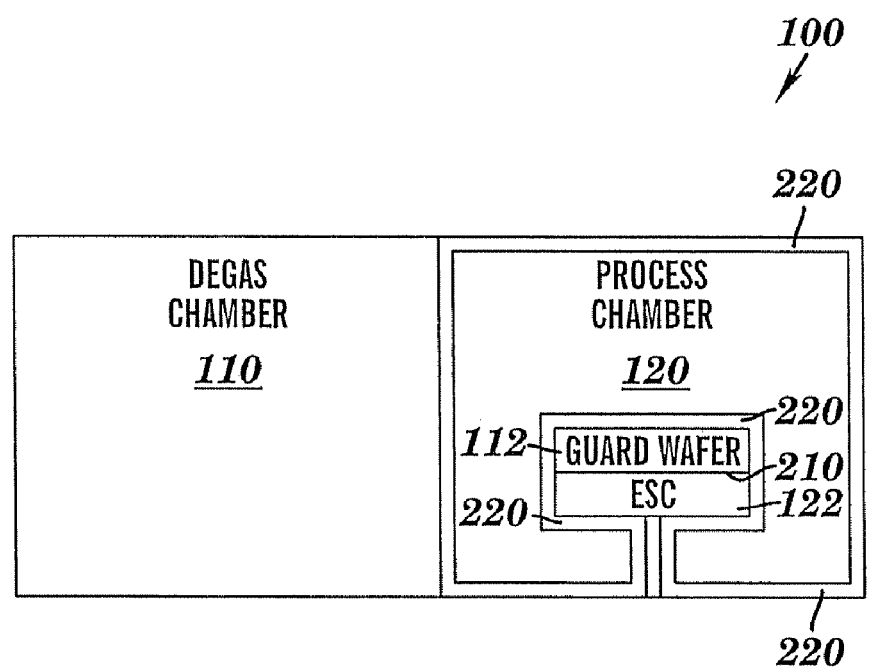

Next, with reference to FIG. 2, the guard wafer 112 can be placed on a top surface 210 of the electrostatic chuck 122 in the process chamber 120. Next, a thick metal (e.g., copper) layer 220, generally, 1000 Å or thicker, can be formed on the entire inner surfaces of the process chamber 120 and on the outer surfaces of the guard wafer 112. The purpose of the thick metal layer 220 is to condition (i.e., prepare) the process chamber 120 for next fabrication steps. More specifically, the purpose of the thick metal layer 220 is to absorb and restrain particles (not shown) residing on surfaces inside the process chamber 120 so that these particles will not interfere with the ensuing fabrication steps performed in the process chamber 120. Therefore, the thick metal layer 220 can also be referred to as the particle restraining layer 220.

Next, the guard wafer 112 can be removed from the electrostatic chuck 122 so that the top surface 210 of the electrostatic chuck 122 is exposed to the ambient inside the process chamber 120.

Figure 3:
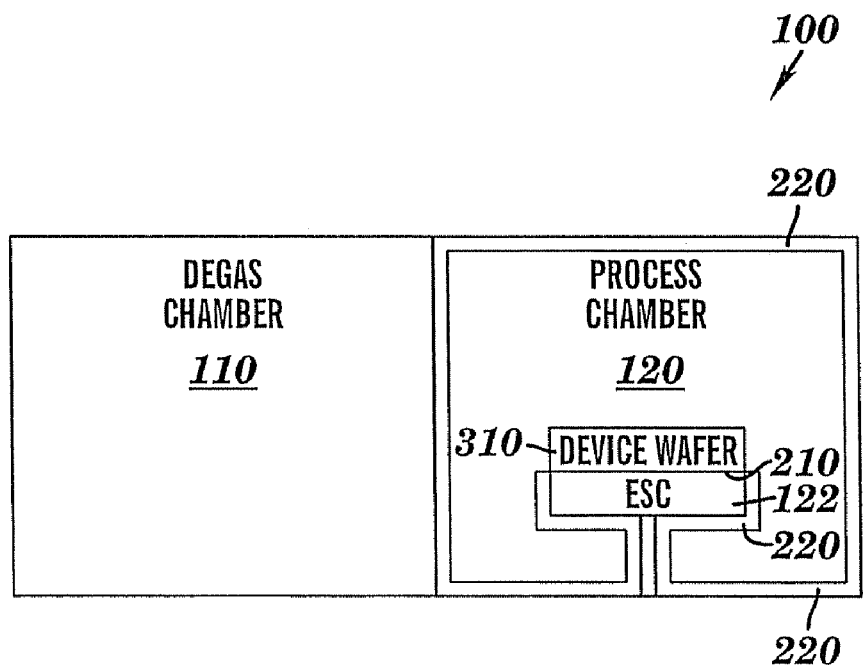

Next, with reference to FIG. 3, a device wafer 310 (on which semiconductor devices are to be formed) can be placed on and in direct physical contact with the top surface 210 of the electrostatic chuck 122. Next, with reference to FIG. 4, the thin film deposition process can be completed by depositing a thin film 410 (generally, 10-200 Å thick) on top of the device wafer 310. After that, the device wafer 310 can be removed so that another device wafer (not shown) can be placed on the electrostatic chuck 122 for processing, and so on until the next process chamber conditioning. In one embodiment, for the next process chamber conditioning, the same guard wafer 112 can be reused (the same guard wafer 112 can be reused multiple times). Alternatively, for the next process chamber conditioning, a new guard wafer (not shown) can be used.

In summary, the guard wafer 112 (FIG. 2) is used to prevent the later deposited particle restraining layer 220 from depositing on the top surface 210 of the electrostatic chuck 122. As a result, the device wafer 310 (FIG. 3), when being placed on the electrostatic chuck 122, comes into direct physical contact with the top surface 210 of the electrostatic chuck 120. Therefore, the device wafer 310 is tightly coupled to the electrostatic chuck 120.

Figure 4:
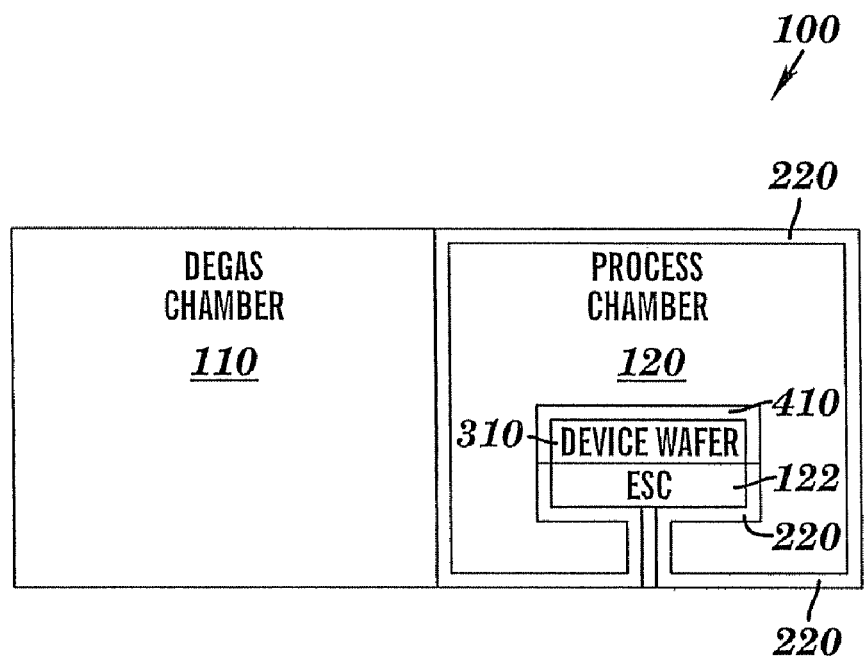

Without the guard wafer 112 (FIG. 2), the particle restraining layer 220 would form on the top surface 210 of the electrostatic chuck 122. As a result, the device wafer 310 (FIG. 3), when being placed on the electrostatic chuck 122, could not come into direct physical contact with the top surface 210 of the electrostatic chuck 122. Therefore, the device wafer would not be tightly coupled to the electrostatic chuck. This might detrimentally affect the accuracy of the ensuing fabrication steps including the step of depositing the thin film 410 (FIG. 4).

With reference back to FIG. 1, in one embodiment, the guard wafer 112 can comprise essentially only aluminum. Aluminum is selected because (a) aluminum absorbs relatively much less moisture than many other materials, therefore, it takes relatively less time (hence less cost) to bake an aluminum guard wafer in the degas chamber 110, (b) aluminum is inexpensive, (c) aluminum can withstand temperatures above 100° C. in the degas chamber 110, and (d) if an aluminum guard wafer is to be reused, cleaning the aluminum guard wafer is relatively easy and inexpensive.

In another embodiment, the guard wafer 112 can comprise an aluminum alloy. In a yet another embodiment, the guard wafer 112 can comprise a metal alloy that essentially does not contain aluminum (e.g., iron-copper alloy, stainless steel which is alloy containing iron). In a yet another embodiment, the guard wafer 112 can comprise a semiconductor oxide (e.g., silicon dioxide, quarts, glass, etc.)

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. An apparatus, comprising:
   (a) a process chamber;
   (b) a chuck in the process chamber;
   (c) a guard wafer placed on and in direct physical contact with the chuck; and
   (d) a particle restraining layer on essentially all surfaces that are exposed to the ambient inside the process chamber,
   wherein the particle restraining layer has a thickness in a first direction of at least 500 nm,
   wherein the first direction is essentially perpendicular to an interfacing surface between the particle restraining layer and the chuck, and
   wherein the guard wafer comprises a material selected from the group consisting of a metal and a semiconductor oxide.

2. The apparatus of claim 1, wherein the guard wafer comprises essentially aluminum.

3. The apparatus of claim 1, wherein the guard wafer comprises an aluminum alloy.

4. The apparatus of claim 1, wherein the guard wafer comprises an alloy not including aluminum.

5. The apparatus of claim 1, wherein the guard wafer comprises an iron alloy.

6. The apparatus of claim 1, wherein the guard wafer comprises a semiconductor oxide.

7. The apparatus of claim 6, wherein the semiconductor oxide comprises silicon dioxide.

* * * * *